US006586935B1

(12) United States Patent
Ma et al.

(10) Patent No.: US 6,586,935 B1
(45) Date of Patent: Jul. 1, 2003

(54) MAGNETIC RESONANCE IMAGE ARTIFACT CORRECTION USING NAVIGATOR ECHO INFORMATION

(75) Inventors: Jingfei Ma, Waukesha, WI (US); Richard Scott Hinks, Waukesha, WI (US); Kevin F. King, New Berlin, WI (US); Graeme C. McKinnon, Hartland, WI (US)

(73) Assignee: GE Medical Technology Services, Inc., Pewaukee, WI (US)

( * ) Notice: Subject to any disclaimer, the term of this patent is extended or adjusted under 35 U.S.C. 154(b) by 0 days.

(21) Appl. No.: 09/540,820

(22) Filed: Mar. 31, 2000

(51) Int. Cl.$^7$ ................................................. G01V 3/00
(52) U.S. Cl. ........................ 324/312; 324/309; 324/307; 324/318
(58) Field of Search ................................ 324/307, 309, 324/312, 314, 300, 318, 306, 308, 310, 311

(56) References Cited

U.S. PATENT DOCUMENTS

| | | | | |
|---|---|---|---|---|
| 4,937,526 A | * | 6/1990 | Ehman et al. | 324/309 |
| 5,539,312 A | * | 7/1996 | Fu et al. | 324/309 |
| 5,581,184 A | * | 12/1996 | Heid | 324/309 |
| 6,037,771 A | * | 3/2000 | Liu et al. | 324/309 |
| 6,064,206 A | * | 5/2000 | Van Vaals et al. | 324/312 |

* cited by examiner

Primary Examiner—Edward Lefkowitz
Assistant Examiner—Tiffany A. Fetzner
(74) Attorney, Agent, or Firm—Fletcher, Yoder & Van Someren

(57) ABSTRACT

A technique is provided for characterizing and correcting for instabilities or variations in a magnet system of an MRI scanner. The technique makes use of a navigator pulse to read out navigator echo data in the absence of phase encode, or with phase encode effects rewound. The navigator data is used to characterize several potential effects of magnet system instabilities or variations, such as zeroth order phase shifts, first order (linear) phase shifts, bulk position shifts, and amplitude effects. The effects of the instabilities can be used, then, to correct image data acquired during an examination.

35 Claims, 5 Drawing Sheets

| | δB₀(t) | | | δGx(t) | | | δGy(t) | | | δGz(t) | | |
|---|---|---|---|---|---|---|---|---|---|---|---|---|
| | Δ1 | Δ2 | Δ3 | Δ1 | Δ2 | Δ3 | Δ1 | Δ2 | Δ3 | Δ1 | Δ2 | Δ3 |
| TIME SIGNAL (K-SPACE) | AMP. | 0TH ORDER PHASE | 1ST ORDER PHASE | AMP. | POSITION SHIFT | FOV / POSITION SHIFT | AMP. | AMP. | 0TH ORDER PHASE / AMP. | AMP. | AMP. | 0TH ORDER PHASE / AMP. |
| SPATIAL SIGNAL (AFTER FT) | AMP. | 0TH ORDER PHASE | POSITION SHIFT | AMP. | 1ST ORDER PHASE | 1ST ORDER PHASE / AMP. | AMP. | AMP. | 0TH ORDER PHASE / AMP. | AMP. | AMP. | 0TH ORDER PHASE / AMP. |

FIG. 4

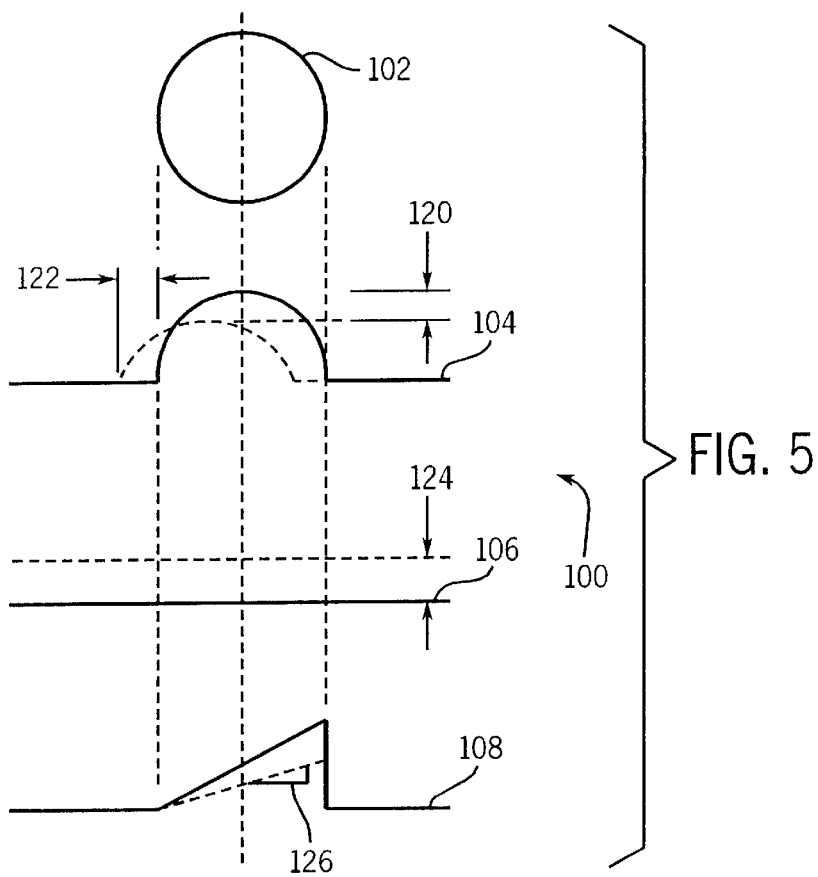
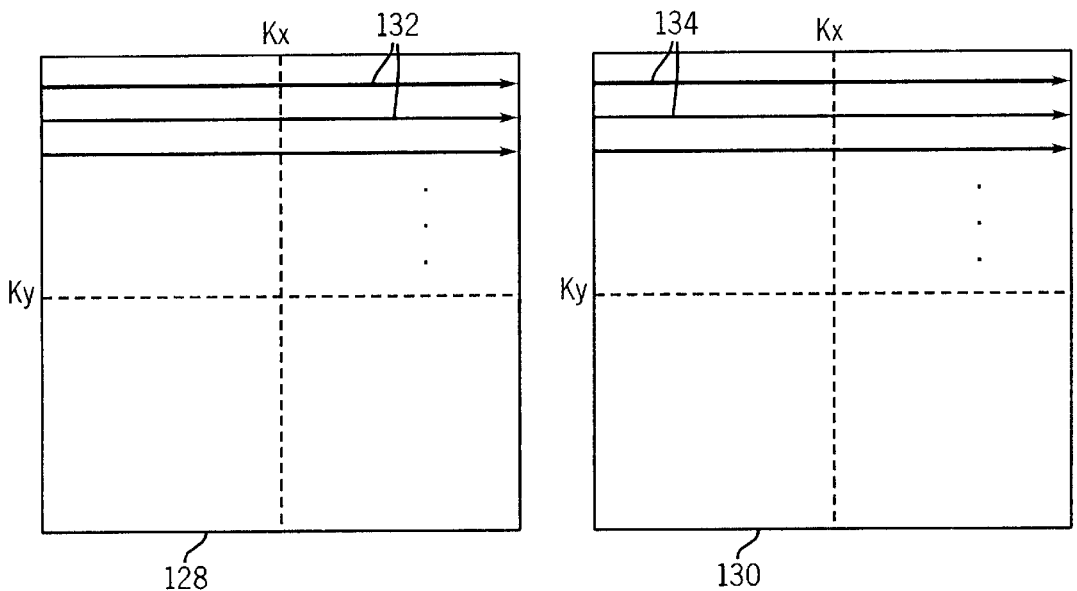

MAGNETIC RESONANCE IMAGE ARTIFACT CORRECTION USING NAVIGATOR ECHO INFORMATION

FIELD OF THE INVENTION

The present invention relates generally to the field of magnetic resonance imaging systems such as though used in medical imaging applications. More particularly, the invention relates to a technique for correcting image artifacts resulting from instabilities in a magnet system by use of phase, position and amplitude information acquired from a navigator echo integrated into a pulse sequence description of an imaging examination.

BACKGROUND OF THE INVENTION

Magnetic resonance imaging systems have become an extremely useful tool for medical applications, permitting non-invasive diagnostics of a range of anatomies and tissues. In general, MRI systems produce excitations in gyromagnetic material within a selected slice of a patient, and then detect emissions from the gyromagnetic material for reconstruction of a useful image. In general, a main or primary magnetic field is generated by a strong magnet surrounding a patient bore or other region in which the anatomy to be imaged is positioned. Gradient coils produce gradient magnetic fields which are properly oriented to select a slice of tissue to be imaged, to phase encode specific locations or volume elements (voxels) within the tissue, and frequency encode the voxels. Radio frequency pulses excite the gyromagnetic material, and a receiver coil detects the resulting emissions. Following conditioning of the resulting signals, and two-dimensional fast Fourier transformation, the useful image may be reconstructed wherein individual picture elements or pixels correspond to the voxels of the selected slice.

It has been found that, in MRI systems, instabilities within a magnet system can produce time-dependent variations in the main magnetic field. Again, the main magnetic field is produced by a fairly strong magnet, the field of which is oriented horizontally (such as in most conventional scanners) or vertically (such as in "open" scanners). In addition to the variations in the main magnetic field, such instabilities may also result in time-dependent variations in the spatially linear fields produced by the gradient coils. Such variations cause the gyromagnetic material to be imaged to be excited or encoded in a manner different from that predicted in establishing the pulse sequence description used to drive the coils and produce the magnetic fields. As a result, artifacts may be visible in the reconstructed image which may adversely affect the image clarity, and reduce the utility of the image.

There is a need, therefore, for an improved technique for correcting or compensating for instabilities in an MRI magnet system which can improve image quality. In particular, there is a present need for a straight forward system which can be implemented in a wide variety of systems to detect and compensate for magnet system instabilities to eliminate or substantially reduce the occurrence of imaging artifacts.

SUMMARY OF THE INVENTION

The present invention provides a correction or compensation technique for MRI systems designed to respond to these needs. The technique may be applied to new and existing systems, and may be implemented through software used to define a pulse sequence description on which the gradient and radio frequency pulses are based. While variants of the technique may be employed to correct for deviations in spatially higher order terms in the magnet system, the technique is particularly well suited to detection and correction of perturbations in the magnet system performance due to variations in zeroth order and spatially linear fields produced by the gradient coils and environmental factors, such as support structures, floors, and so forth. The technique allows for characterization of various magnet system instability effects, and correction of image data based upon these characterizations.

In accordance with certain aspects of the technique, phase, position and amplitude information is collected from a navigator echo acquired along with image data in an imaging sequence. The navigator echo characterizes the imaging effect of time-dependent field changes. In general, the navigator echo is an echo signal which is acquired without application of phase encode gradients or with the effect of phase encode gradients rewound before data acquisition. The placement of the navigator echo in the pulse sequence may be such that the echo is in close proximity in time to the regular image echo, such that the characterization is accurate and complete, permitting variations in the magnet system performance to be accurately corrected in the resulting image data. The resulting corrections may account for the effects of the instabilities on parameters of the acquired data, such as amplitude, zeroth order phase shifts, and first order phase shifts. Moreover, the characterizations may correct for position shifts, and combinations of these effects in the resulting image data.

BRIEF DESCRIPTION OF THE DRAWINGS

FIG. 4 is a table indicating typical characteristic perturbations or deviations which may result in the time domain and in the space domain from certain variations or instabilities in a magnet system of an MRI system;

FIG. 5 is a graphical representation of the typical characteristic effects of the system as summarized in FIG. 4;

FIG. 6 is a graphical representation of k-space data collected through an imaging sequence incorporating a navigator echo technique as illustrated in FIG. 3.

DETAILED DESCRIPTION OF THE INVENTION

Figure 1:
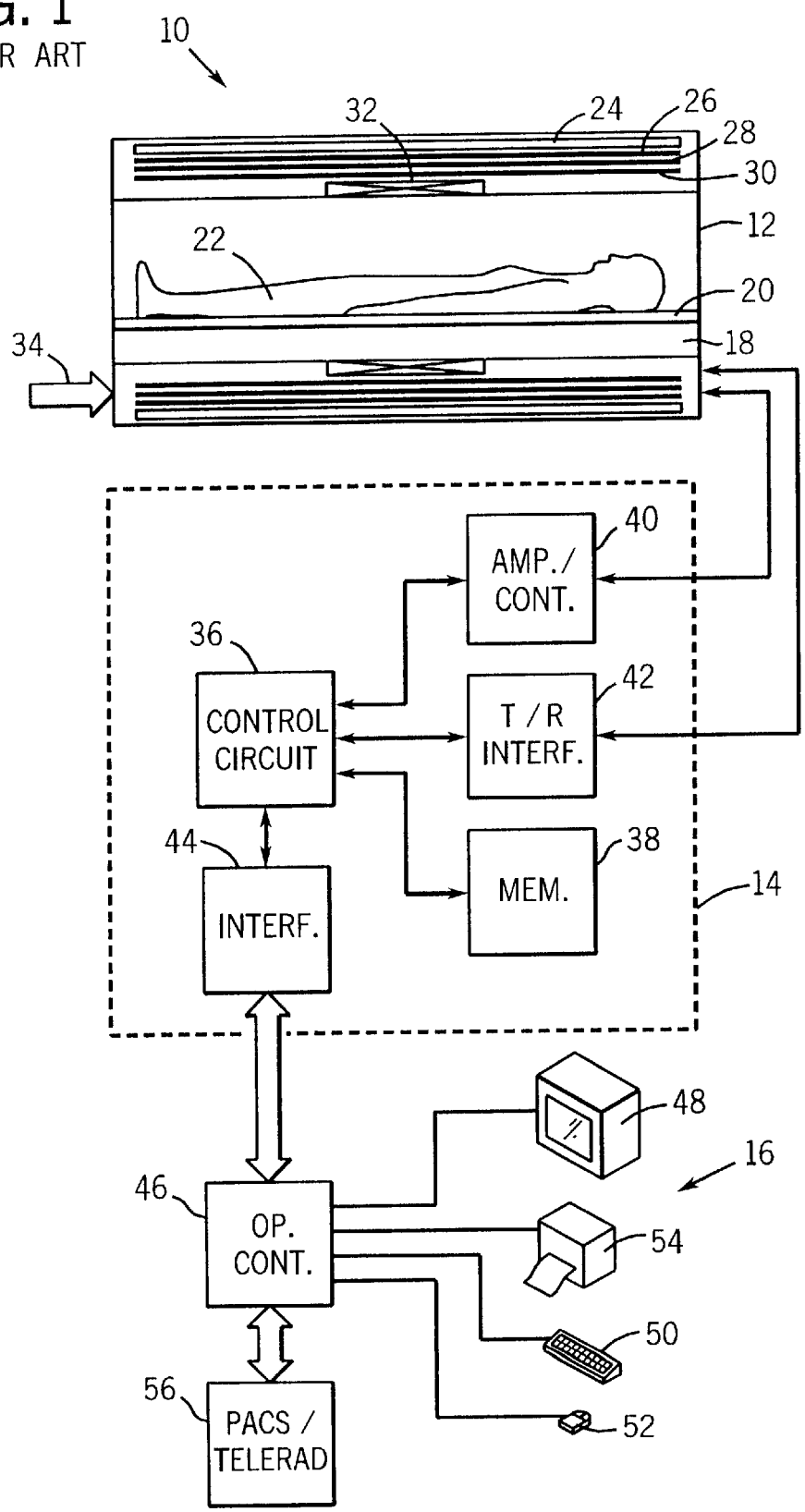
FIG. 1 is a diagrammatical representation of an MRI system for use in medical diagnostic imaging and implementing certain aspects of the present technique.

Turning now to the drawings, and referring first to FIG. 1, a magnetic resonance imaging (MRI) system 10 is illustrated diagrammatically as including a scanner 12, scanner control circuitry 14, and system control circuitry 16. While MRI system 10 may include any suitable MRI scanner or detector, in the illustrated embodiment the system includes a full body scanner comprising a patient bore 18 into which a table 20 may be positioned to place a patient 22 in a desired position for scanning. Scanner 12 may be of any suitable type of rating, including scanners varying from 0.5 Tesla ratings to 1.5 Tesla ratings and beyond.

Scanner 12 includes a series of associated coils for producing controlled magnetic fields, for generating radio frequency excitation pulses, and for detecting emissions from gyromagnetic material within the patient in response to such pulses. In the diagrammatical view of FIG. 1, a primary magnet coil 24 is provided for generating a primary magnetic field generally aligned with patient bore 18. A series of gradient coils 26, 28 and 30 are grouped in a coil assembly for generating controlled magnetic gradient fields during examination sequences as described more fully below. A radio frequency coil 32 is provided for generating radio frequency pulses for exciting the gyromagnetic material. In the embodiment illustrated in FIG. 1, coil 32 also serves as a receiving coil. Thus, RF coil 32 may be coupled with driving and receiving circuitry in passive and active modes for receiving emissions from the gyromagnetic material and for outputting radio frequency excitation pulses, respectively. Alternatively, various configurations of receiving coils may be provided separate from RF coil 32. Such coils may include structures specifically adapted for target anatomies, such as head coil assemblies, and so forth. Moreover, receiving coils may be provided in any suitable physical configuration, including phased array coils, and so forth.

The coils of scanner 12 are controlled by external circuitry to generate desired fields and pulses, and to read emissions from the gyromagnetic material in a controlled manner. As will be appreciated by those skilled in the art, when the material, typically bound in tissues of the patient, is subjected to the primary field, individual magnetic moments of the paramagnetic nuclei in the tissue attempt to align with the field but precess in a random order at their characteristic or Larmor frequency. While a net magnetic moment is produced in the direction of the polarizing field, the randomly oriented components of the moment in a perpendicular plane generally cancel one another. During an examination sequence, an RF frequency pulse is generated at or near the Larmor frequency of the material of interest, resulting in rotation of the net aligned moment to produce a net transverse magnetic moment. Radio signals are emitted following the termination of a the excitation signals. This magnetic resonance signal is detected in the scanner and processed for reconstruction of the desired image.

Gradient coils 26, 28 and 30 serve to generate precisely controlled magnetic fields, the strength of which vary over a predefined field of view, typically with positive and negative polarity. When each coil is energized with known electric current, the resulting magnetic field gradient is superimposed over the primary field and produces a linear variation in the overall magnetic field strength across the field of view. Combinations of such fields, orthogonally disposed with respect to one another, enable the creation of a linear gradient in any direction by vector addition of the individual gradient fields.

The gradient fields may be considered to be oriented both in physical planes, as well as by logical axes. In the physical sense, the fields are mutually orthogonally oriented to form a coordinate system which can be rotated by appropriate manipulation of the pulsed current applied to the individual field coils. In a logical sense, the coordinate system defines gradients which are typically referred to as slice select gradients, frequency encoding gradients, and phase encode gradients.

The slice select gradient determines a slab of tissue or anatomy to be imaged in the patient. The slice select gradient field may thus be applied simultaneous with a selective RF pulse to excite a known volume of spins within a desired slice that precess at the same frequency. The slice thickness is determined by the bandwidth of the RF pulse and the gradient strength across the field of view.

A second logical gradient axis, the frequency encoding gradient axis is also known as the readout gradient axis, and is applied in a direction perpendicular to the slice select gradient. In general, the frequency encoding gradient is applied before and during the formation of the MR echo signal resulting from the RF excitation. Spins of the gyromagnetic material under the influence of this gradient are frequency encoded according to their spatial position across the gradient field. By Fourier transformation, acquired signals may be analyzed to identify their location in the selected slice by virtue of the frequency encoding.

Finally, the phase encode gradient is generally applied in a sequence before the readout gradient and after the slice select gradient. Localization of spins in the gyromagnetic material in the phase encode direction is accomplished by sequentially inducing variations in phase of the precessing protons of the material by using slightly different gradient amplitudes that are sequentially applied during the data acquisition sequence. Phase variations are thus linearly imposed across the field of view, and spatial position within the slice is encoded by the polarity and the degree of phase difference accumulated relative to a null position. The phase encode gradient permits phase differences to be created among the spins of the material in accordance with their position in the phase encode direction.

As will be appreciated by those skilled in the art, a great number of variations may be devised for pulse sequences employing the logical axes described above. Moreover, adaptations in the pulse sequences may be made to appropriately orient both the selected slice and the frequency and phase encode to excite the desired material and to acquire resulting MR signals for processing.

The coils of scanner 12 are controlled by scanner control circuitry 14 to generate the desired magnetic field and radio frequency pulses. In the diagrammatical view of FIG. 1, control circuitry 14 thus includes a control circuit 36 for commanding the pulse sequences employed during the examinations, and for processing received signals. Control circuit 36 may include any suitable programmable logic device, such as a CPU or digital signal processor of a general purpose or application-specific computer. Control circuit 36 further includes memory circuitry 38, such as volatile and non-volatile memory devices for storing physical and logical axis configuration parameters, examination pulse sequence descriptions, acquired image data, programming routines, and so forth, used during the examination sequences implemented by the scanner.

Interface between the control circuit 36 and the coils of scanner 12 is managed by amplification and control circuitry 40 and by transmission and receive interface circuitry 42. Circuitry 40 includes amplifiers for each gradient field coil to supply drive current to the field coils in response to control signals from control circuit 36. Interface circuitry 42 includes additional amplification circuitry for driving RF coil 32. Moreover, where the RF coil serves both to emit the radio frequency excitation pulses and to receive MR signals, circuitry 42 will typically include a switching device for toggling the RF coil between active or transmitting mode, and passive or receiving mode. A power supply, denoted generally by reference numeral 34 in FIG. 1, is provided for energizing the primary magnet 24. Finally, circuitry 14 includes interface components 44 for exchanging configuration and image data with system control circuitry 16. It should be noted that, while in the present description reference is made to a cylindrical bore imaging system employing a superconducting primary field magnet assembly, the present technique may be applied to various other configurations, such as scanners employing vertical fields with permanent magnets and electromagnets.

System control circuitry 16 may include a wide range of devices for facilitating interface between an operator or radiologist and scanner 12 via scanner control circuitry 14. In the illustrated embodiment, for example, an operator controller 46 is provided in the form of a computer work station employing a general purpose or application-specific computer. The station also typically includes memory circuitry for storing examination pulse sequence descriptions, examination protocols, user and patient data, image data, both raw and processed, and so forth. The station may further include various interface and peripheral drivers for receiving and exchanging data with local and remote devices. In the illustrated embodiment, such devices include a conventional computer keyboard 50 and an alternative input device such as a mouse 52. A printer 54 is provided for generating hard copy output of documents and images reconstructed from the acquired data. A computer monitor 48 is provided for facilitating operator interface. In addition, system 10 may include various local and remote image access and examination control devices, represented generally by reference numeral 56 in FIG. 1. Such devices may include picture archiving and communication systems, teleradiology systems, and the like.

Figure 2:
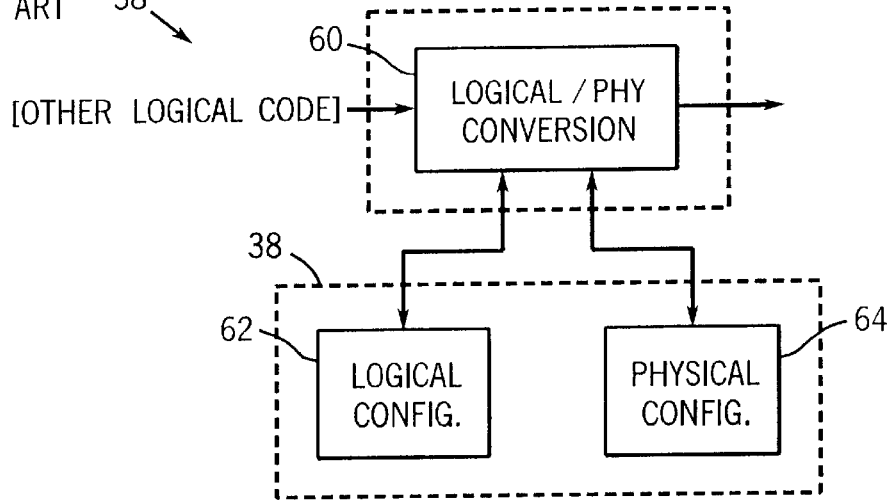
FIG. 2 is a block diagram of functional components of a pulse sequence description module and a controller for a system of the type illustrated in FIG. 1.

In general, these pulse sequences implemented in the MRI system will be defined by both logical and physical configuration sets and parameter settings stored within control circuitry 14. FIG. 2 represents, diagrammatically, relationships between functional components of control circuit 36 and configuration components stored with memory circuitry 38. The functional components facilitate coordination of the pulse sequences to accommodate preestablished settings for both logical and physical axes of the system. In general, the axis control modules, denoted collectively by reference numeral 58, include a logical-to-physical module 60 which is typically implemented via software routines executed by control circuit 36. In particular, the conversion module is implemented through control routines which define particular pulse sequences in accordance with preestablished imaging protocols.

When called upon, code defining the conversion module references logical sets may include parameters such as pulse amplitudes, beginning times, time delays, and so forth, for the various logical axes described above. The physical configuration sets, on the other hand, will typically include parameters related to the physical constraints of the scanner itself, including maximum and minimum allowable currents, switching times, amplification, scaling, and so forth. Conversion module 60 serves to generate the pulse sequence for driving the coils of scanner 12 in accordance with constraints defined in these configuration sets. The conversion module will also serve to define adapted pulses for each physical axis to properly orient (e.g. rotate) slices and to encode gyromagnetic material in accordance with desired rotation or reorientations of the physical axes of the image.

Figure 3:
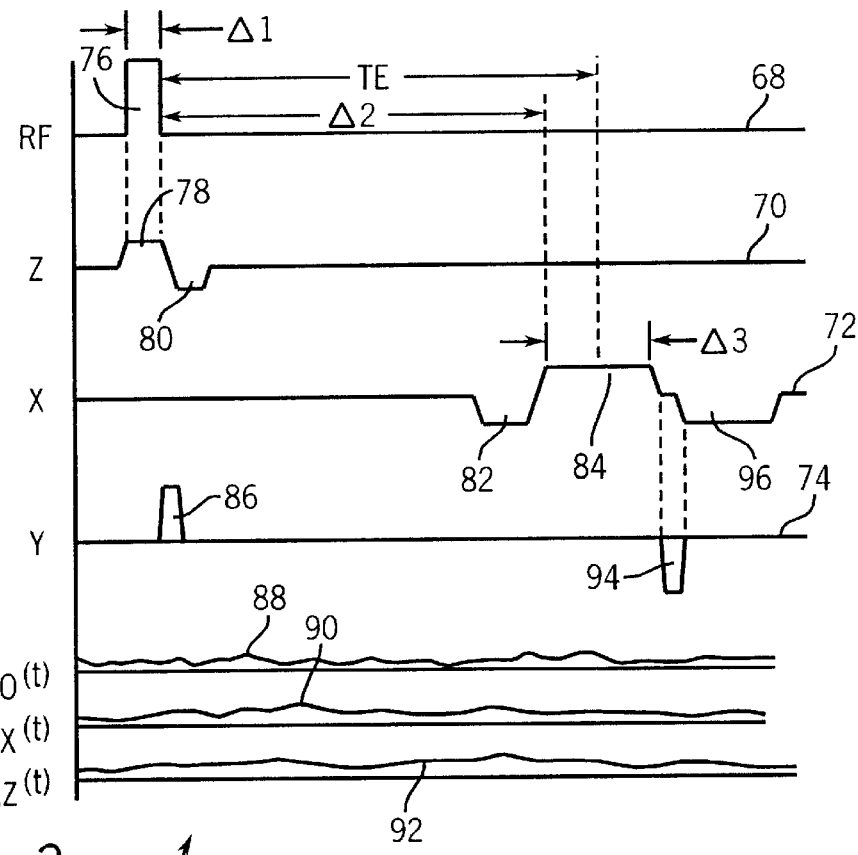
FIG. 3 is a graphical representation of an exemplary pulse sequence description for an MRI examination implementing a characterizing navigator echo technique in accordance with aspects of the present invention.

By way of example, FIG. 3 illustrates a typical pulse sequence which may be implemented on a system such as that illustrated in FIG. 1 and calling upon configuration and conversion components such as those shown in FIG. 2. The pulse sequence description illustrated in FIG. 3, and designated generally by reference numeral 66, includes a navigator gradient pulse for detecting echoes used to characterize and compensate for variations or instabilities in the magnet system of the MRI scanner. The pulse sequence description of FIG. 3 may be referred to generally as a gradient echo sequence. It should be noted, however, that a similar characterization and correction technique may be used for other pulse sequences such as spin echo sequences. The present technique is not intended to be limited to any particular type of pulse sequence.

In the exemplary pulse sequence of FIG. 3, radio frequency and gradient pulses may be represented along logical axes, including an RF axis 68, and slice select axis 70, a readout axis 72, and a phase encode axis 74. As will be appreciated by those skilled in the art, during the pulse sequence description of the examination, various gradients are played out on the logical axes, translated to physical axes based upon the configurations sets 62 and 64 (see FIG. 2). In the example of FIG. 3, the pulse sequence description 66 begins with a RF excitation pulse 76 having a duration $\Delta 1$. During this excitation pulse, a slice select gradient pulse 78 is generated on the logical slice select axis 70, followed by a rephasing gradient 80. Subsequently, a prephasing gradient 82 is generated on the logical readout axis 72. This prephasing gradient is followed by a readout gradient 84 in the example illustrated in FIG. 3. A central region of the readout gradient 84 is coordinated at a time TE following termination of the excitation pulse 76, corresponding to the echo time of the pulse sequence. Moreover, it should be noted that the onset of the readout gradient 84 corresponds to a time referred to in FIG. 3 as $\Delta 2$ following the termination of the excitation pulse.

In addition to the foregoing pulses, the pulse sequence description 66 includes a phase encode gradient 86 generated on the logical phase encode axis 74, which is applied at a period in time generally corresponding to the slice rephasing gradient 80. The combination of the gradients illustrated in FIG. 3 result in emissions from the gyromagnetic material encoded, which are sensed by the RF coil during the readout gradient period 84. In the nomenclature illustrated in FIG. 3, the duration of the readout gradient 84 is generally denoted as a time $\Delta 3$.

It has been found that variations or instabilities in the magnet system of the MRI scanner can result in anomalies in the collected data, which in turn result in artifacts or errors in reconstructed images based upon the data. In FIG. 3, such variations are represented generally by reference numerals 88, 90 and 92. In particular, variations 88 may be considered to occur in the primary magnetic field produced by the primary magnet coil 24 (see FIG. 1) and external factors, such as support structures, floors, and so forth. Moreover, other variations 90 may exist along the logical readout axis, with their effects being imposed on the data collected during the readout period. Finally, variations 92 may occur in gradient fields produced along the logical slice select axis and along the logical phase encode axis. As summarized below, all such variations may result in anomalies in the image data, potentially manifesting themselves as unwanted artifacts in the reconstructed images.

To characterize and correct for such artifacts, the present technique provides, within the pulse sequence description 66, a navigator gradient pulse which is played out on the readout axis for collecting additional data (navigator data) used to determine characteristic effects of field variations and instabilities. In the embodiment illustrated in FIG. 3, the technique includes application of a refocus pulse 94 along the logical phase encode axis 74. The refocus pulse effectively rewinds the phase encode gradients before acquisition of the characterizing navigator data. The refocus pulse 94 is followed by a navigator gradient 96 which, in the illustrated embodiment, has a polarity opposite that of the original readout gradient 84. It should be noted, however, that the navigator gradient could have the same polarity as the readout gradient, such as through the use of a balancing gradient on the readout axis between the readout and navigator gradients. It should also be noted that, in the preferred embodiment illustrated, the navigator gradient is used to collect data in a similar manner to the readout gradient, and closely following the readout gradient. Thus, navigator data collected for characterizing the anomalies in the fields will closely characterize the field variations which may be present during the image data acquisition portion of the pulse sequence description. Moreover, the readout time and gradient amplitude of the navigator gradient could be equal to the readout gradient, or could be reduced, both in time and amplitude, such as to minimize timing constraints or self-induced additional field perturbations.

Typical characteristic effects of variations in the primary and gradient fields on image data are summarized in the table of FIG. 4. In FIG. 4, notations are made for characteristic changes or effects of a time signal (in k-space) as well as for spatial signals (after Fourier transformation). Moreover, in FIG. 4, both for the time signals and spatial signals, characteristic effects of field variations are indicated separately for the primary field, for the readout axis field, for the slice select axis field, and for the phase encode axis field.

In the absence of such field perturbations, the echo signal resulting from excitation and encoding during the pulse sequence description may be expressed by the relationship:

$$S(t) \sim \int \rho(x) e^{-ik(t)x} dx \quad [1]$$

where $$k(t) = \gamma \int_0^t G_x(\tau) d\tau,$$

$\rho$ is the spin density parameter, x represents the space parameter, t represents time, and S represents the signal. In the equation for k(t), the constant $\gamma$ represents the gyromagnetic ratio (a constant for the encoded species) G is the gradient amplitude, and $\tau$ is a time parameter. However, when field perturbations are present, their impact on the ideal signal as expressed by the above relationship can be examined as follows.

Assuming that the field perturbation is fairly constant during the RF excitation period $\Delta 1$ (refer to the pulse sequence description of FIG. 3, and to the table of FIG. 4), the position, the thickness and the orientation of the ideal physical slice will be altered by the variations in the primary magnetic field, the slice select gradient field, and by the readout and phase encode gradient fields, respectively. When the perturbations in the primary magnetic field are small, compared to the RF bandwidth, and the variations in the gradient fields are small (compared to the slice select gradient), the main impact on the signal is expected to be on a signal amplitude, as indicated in FIG. 4. During the time after the RF excitation pulse, and before the data acquisition or readout pulse (see $\Delta 2$ in FIG. 3), variations in the primary magnetic field will introduce a constant phase modulation, which is proportional to:

$$\phi_o \sim \gamma \int_0^{TE} \delta B_o(\tau) d\tau. \quad [2]$$

Variations in the readout axis gradient will introduce a (time) position shift to the echo signal, which is proportional to $$t_o \sim \int_0^{TE} \delta G_x(\tau) d\tau. \quad [3]$$

Finally, variations in the slice select and phase encode axis gradients will, on the other hand, introduce an intra-voxel de-phasing, and thus an amplitude modulation to the signal. These characteristic effects are also summarized in the table of FIG. 4 for each of the primary and gradient fields, under the columns $\Delta 2$.

Assuming that the field perturbation is fairly constant during the data acquisition period indicated by $\Delta 3$ in FIG. 3, variations in the primary magnetic field will cause a linear phase modulation. Variations in the readout axis gradient field will cause a change the echo position, as well as a change in the field-of-view (FOV). Finally, variations in the slice select axis and phase encode axis gradient fields will tilt the readout angle, and thus (primarily) impose an amplitude modulation to the signal. These effects are further summarized in FIG. 4 for each of the varying fields.

The characteristic effects or anomalies summarized in FIG. 4 are graphically illustrated in FIG. 5, and denoted collectively by the reference numeral 100. The anomalies are graphically illustrated for a spherical phantom 102 for which image data and navigator data are collected. As illustrated in FIG. 5, certain anomalies may be viewed as occurring on an amplitude plot for the image data, as indicated at reference numeral 104. Zeroth order phase shifts may also occur as indicated in a plot 106. Finally, linear first order phase shifts may occur as indicated along a plot 108.

The effects on the signal amplitude, as illustrated in plot 104 may manifest themselves in several manners. For example, amplitude variations (increases or decreases in amplitude) may occur as, indicated at reference numeral 120. Similarly, position shifts 122 may occur. The amplitude variations and position shifts may also occur in varying degrees at the same time. As regards the zeroth order phase shift, certain variations in the magnetic fields can result in an offset 124 of image data from the desired axis (along which the phase shift is essentially null), as illustrated in plot 106. Similarly, in terms of the first order phase shift 108, the variations in the magnetic fields may cause the image data to exhibit slopes 126 different from those anticipated or desired for the image.

Figure 7:
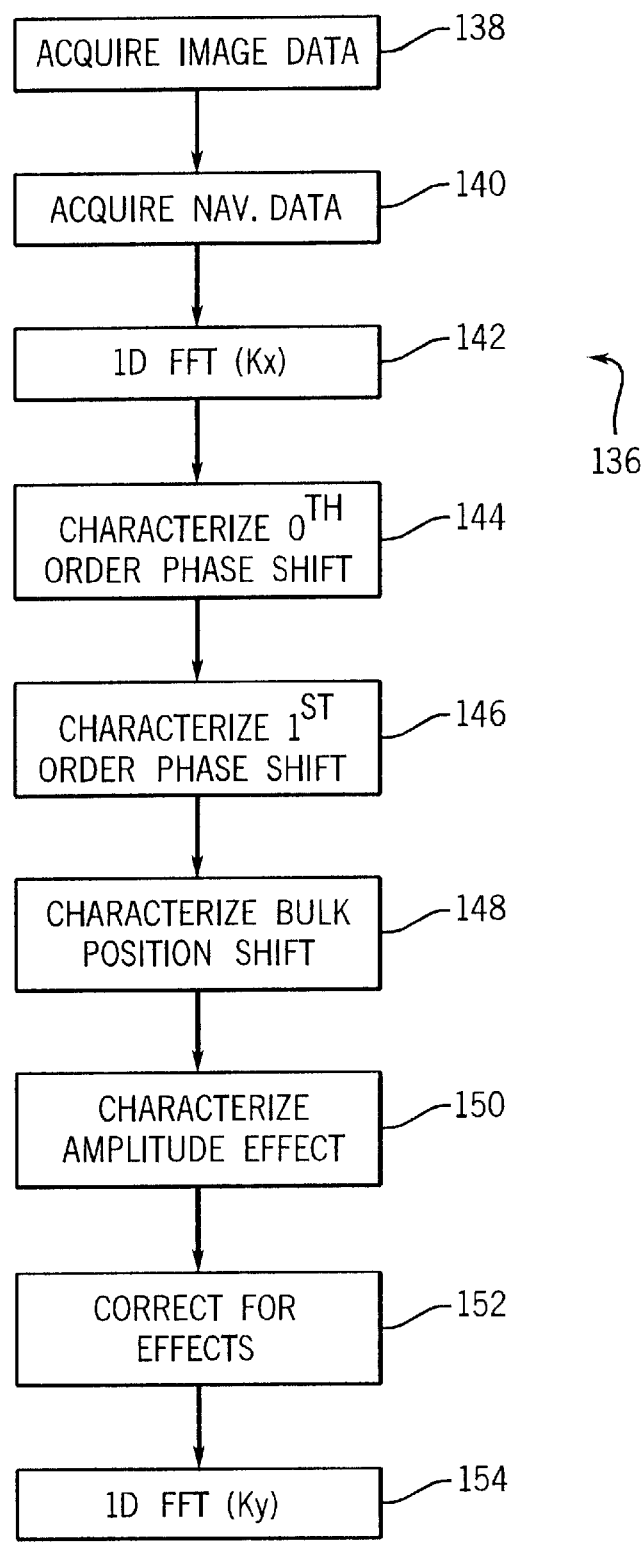
FIG. 7 is a flow chart illustrating exemplary control logic for carrying out an image acquisition sequence incorporating such a navigator echo technique.

The present technique, employing the navigator gradient to detect, characterize, and correct for such magnet system instabilities, implements a process illustrated graphically in FIG. 6, and summarized through a series of logical steps in FIG. 7. In general, the technique provides for playing out a navigator gradient pulse along the readout axis, with the phase encode gradient absent or its effect cancelled as summarized above. Image data is collected, as indicated by the k-space data 128 in FIG. 6, during the image data acquisition period corresponding to readout gradient 84 (see FIG. 3). Navigator data, as indicated by the k-space data 130 in FIG. 6 is then collected during the period of the navigator gradient 96. It should be noted, however, that due to rephasing, all navigator data will be collected along a zero ky line. For each of the data sets, lines of data 132 and 134, respectively, are collected as represented in k-space in FIG. 6. It should be noted that the data may, in practice, be collected in various sequences above and below a central position along the ky direction. Each line 134 of the navigator data set 130 is used to characterize variations in the magnetic fields and to correct corresponding lines 132 of the image data set 128. FIG. 7 indicates steps in exemplary control logic for carrying out this characterization and correction process.

Referring now to FIG. 7, the control logic, referred to generally by the reference numeral 136, is programmed into the memory circuitry 38 or another memory device (and may be loaded from a remote location, such as via the Internet), and is executed by control circuit 36 or by another processing units. The logic begins with acquisition of image data at step 138. As noted above, various pulse sequence descriptions may be employed for acquiring the image data. In general, however, the image data will be acquired to fill lines of k-space, with the resulting signals being stored for processing. At step 140, the navigator data is acquired as described above. Again, in a presently preferred embodiment, the navigator data is acquired by application of a navigator gradient on a logical readout axis, without application of a phase encode gradient, or with the phase encode gradient rewound before data acquisition. Also, the navigator data is acquired sequentially in time, but along ky=0, and corresponding to the k-space image data.

At step 142 in FIG. 7, the technique continues through a one-dimensional fast Fourier transformation of both data sets acquired in steps 138 and 140. Again, the values resulting from step 142 are stored for further processing. At step 144, the zeroth order phase shift is characterized from the transformed navigator data. In a presently preferred embodiment, the zeroth order phase shift, which as summarized in FIG. 4, typically would be expected to result from magnetic system variations both during the time period between the excitation pulse and the readout, as well as during the readout period, is characterized through application of a characterizing algorithm, such as a least-square fitting algorithm. Such algorithms are generally known to those skilled in the art. In the present context, the algorithms are used to characterize the zeroth order phase shift as the offset of a fitted line or curve from a phase axis as illustrated in FIG. 5.

At step 146 the first order phase shift is characterized from the transformed navigator data. As summarized in FIG. 4, such phase shifts would be expected to result from primary magnetic field variations for the time signal during the readout period, as well as from variations in the readout axis gradient field during the period between the excitation pulse and the readout period for the spatial signal. As for the zeroth order phase shift, the first order phase shift is preferably characterized at step 146 through use of a characterizing algorithm, such as a least-square fitting algorithm. The first order phase shift characterization is then stored for later use.

At step 148 a bulk position shift is characterized from the transformed navigator data. As indicated in FIG. 4, such position shifts would be expected to result from variations in the primary magnetic field and in the readout gradient field, particularly during the readout period and during the time between the excitation pulse and the readout sequence, respectively. In a presently preferred embodiment, the bulk position shift is determined through cross-correlation, a technique which is familiar to those skilled in the art. The resulting position shift data is stored for later use.

At step 150, an amplitude effect is characterized from the transformed navigator data. As summarized in FIG. 4, such amplitude effects would be expected to result from variations in all of the gradient fields, particularly for the spatial signal, during the readout period. Such amplitude effects can reduce or increase the effective amplitude of the signal, as indicated graphically in FIG. 5, and tend to be changes in the integrated navigator echo signals after Fourier transformation. In a presently preferred technique, the area under the amplitude curve is determined at this step to identify and characterize any such amplitude variations in the navigator data.

At step 152, the effects of magnetic field instabilities or variations characterized in steps 144–150 are used to correct the transformed image data. In a present embodiment, this correction is performed as follows.

Assuming the acquired raw data raster (along kx and ky directions of k-space as shown in FIG. 6) is represented by the signal or data set S(kx, ky), the navigator echo data for a given $k_y$ line may be represented as Z(kx). Considering no magnet system instability as discussed above, a two-dimensional Fourier transformation of S(kx, ky) would yield a true representation of the object being imaged:

$$M(x,y) = \int \int S(k_x, k_y) e^{-ik_x x} e^{-ik_y y} dk_x dk_y \qquad [4].$$

However, when magnet system instability exists, artifacts such as ghosting will appear because the data set S(kx, ky) becomes corrupted. To correct the image data, then, the navigator echo data, which may be denoted Z(kx), is used. In particular, as noted above, the information extracted from each navigator echo may include 1) a relative amplitude change, 2) a zeroth order phase shift or error, 3) a linear phase shift or error, and 4) a positional shift.

The correction procedure involves determining the four parameters from the navigator echo data (as described above with reference to steps 144–150), and correcting the image set data S(kx, ky) corresponding to each $k_y$ line:

$$S(k_x, k_y) \rightarrow S'(k_x, k_y) = \delta A \cdot S(k_x - l_x, k_y) e^{-ik_x \Delta} e^{i\phi_0} \qquad [5],$$

where δA is the relative amplitude change of each navigator echo (i.e. represented by the integrated area of the transformed data), 1x is the linear phase shift, Δ is the position shift, and φ0 is the zeroth order phase shift.

Based upon the corrected data set S' (kx, ky), a further one-dimensional fast Fourier transformation is performed as indicated at step 154 to obtain a corrected or artifact-free image data set conforming to relationship [4] above. The corrected data set is then stored and is used to reconstruct a useful image in a conventional manner.

It should be noted that the foregoing process may be subject to certain variations or adaptations, such as for characterizing individual effects, or fewer than all of the effects discussed above. Moreover, similar processes may be employed for characterizing spatially higher order effects of magnetic system instabilities. Similarly, as mentioned above, the technique may be adapted to specific pulse sequence descriptions, and is not intended to be limited to the pulse sequence described or to any particular pulse sequence description.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method for characterizing magnet system instabilities in magnetic resonance imaging system, the method comprising the steps of:

applying magnetic field gradients and a radio frequency excitation pulse to gyromagnetic material of a subject of interest;

applying an image echo readout gradient of a first polarity with a phase encoding gradient, followed by detecting first magnetic resonance signals from the subject;

applying a navigator echo gradient of a second polarity opposite the first polarity of the image echo readout gradient and detecting second magnetic resonance signals representative of magnet system field instabilities due to magnet system structures; and analyzing the second magnetic resonance signals to characterize a plurality of effects of magnet system instabilities.

2. The method of claim 1, wherein the navigator echo gradient is applied following a phase encode rewind pulse to eliminate effects of a phase encode gradient applied prior to the image echo readout gradient.

3. The method of claim 2, wherein the navigator echo gradient is applied immediately following the rewind pulse.

4. The method of claim 1, wherein the plurality of effects are characterized by performing a one dimensional Fourier transform along a readout direction on data representative of the second magnetic resonance signals, and by analyzing resulting data.

5. The method of claim 4, wherein the plurality of effects include a $0^{th}$ order phase shift of navigator echo signals after the Fourier transform.

6. The method of claim 4, wherein the plurality of effects include a $1^{st}$ order phase shift of navigator echo signals after the Fourier transform.

7. The method of claim 4, wherein the plurality of effects include a bulk position shift of navigator echo signals after the Fourier transform.

8. The method of claim 4, wherein the plurality of effects include an amplitude of integrated navigator echo signals after the Fourier transform.

9. A method for generating magnetic resonance image data from a magnetic resonance scanner, the method comprising the steps of:

applying readout gradient pulse of a first polarity with a phase encoding gradient, and a radio frequency pulse to a subject of interest to produce emissions from gyronmagnetic materials within the subject;

detecting the emissions and generating image data representative thereof;

applying a navigator gradient pulse to the subject of interest, the navigator gradient pulse having a second polarity opposite from the first polarity of the image readout pulse used to detect the emissions;

detecting navigator echo signals resulting from the navigator echo pulse and generating navigator echo data representative thereof;

analyzing the navigator echo data to characterize a plurality of effects of anomalies in a magnet system of the scanner due to magnet system structures; and correcting the image data based upon the analysis to generate corrected image data.

10. The method of claim 9, wherein the navigator gradient pulse is applied following a refocus gradient applied to a phase encode logical axis.

11. The method of claim 9, wherein the effects include a $0^{th}$ order phase shift of navigator echo signals after a one-dimensional Fourier transform of the navigator echo data.

12. The method of claim 9, wherein the effects include a $1^{st}$ order phase shift of navigator echo signals after a one-dimensional Fourier transform of the navigator echo data.

13. The method of claim 9, wherein the effects include a bulk position shift of navigator echo signals after a one-dimensional Fourier transform of the navigator echo data.

14. The method of claim 9, wherein the effects include an amplitude change of integrated navigator echo signals after one-dimensional Fourier transform of the navigator echo data.

15. The method of claim 9, wherein the correction step is performed following one-dimensional Fourier transformation of the image data along a readout direction, and wherein the method includes the further step of performing a one-dimensional Fourier transformation of the corrected image data along a phase encode direction.

16. The method of claim 9, wherein the effects include effects of variations of at least a primary magnetic field of the scanner.

17. The method of claim 9, wherein the effects include effects of variations of at least one logical axis magnetic field of the scanner.

18. A method for correcting image data in a magnetic resonance imaging system, the method comprising the steps of:

in the presence of a primary magnetic field, applying a pulse sequence to gradient coils to generate gradient fields and to a radio frequency coil to generate emissions from a subject of interest, including a readout gradient having a first polarity and with a phase encoding gradient;

detecting the emissions and generating image data representative thereof;

applying a navigator readout pulse to the subject, the navigator readout pulse having a second polarity opposite from the first polarity of an image readout pulse used to detect the emissions;

detecting a navigator echo signal and generating navigator data representative thereof;

performing a one-dimensional Fourier transform in a readout direction on the image data and the navigator data;

analyzing the transformed navigator data to characterize effects of variations in the primary or gradient magnetic fields due to magnet system structures;

correcting the transformed image data based upon the characterized effects; and performing a one-dimensional Fourier transform in a phase encode direction on the corrected image data.

19. The method of claim 18, wherein the effects include a $0^{th}$ order phase shift of the navigator echo signals after the one-dimensional Fourier transform of the navigator data.

20. The method of claim 18, wherein the effects include a $1^{st}$ order phase shift of the navigator echo signals after the one-dimensional Fourier transform of the navigator data.

21. The method of claim 18, wherein the effects include a bulk position shift of the navigator echo signals after the one-dimensional Fourier transform of the navigator data.

22. The method of claim 18, wherein the effects include an amplitude change of integrated navigator echo signals after one-dimensional Fourier transform of the navigator data.

23. A magnetic resonance imaging system comprising:

a magnet configured to generate a primary magnetic field;

a set of gradient coils configured to generate gradient fields in the presence of the primary magnetic field;

a radio frequency transmitter and receiver set configured to generate radio frequency pulses and to detect radio frequency emissions from a subject of interest in response to the radio frequency pulses; and a control system coupled to the gradient coils and to the radio frequency transmitter and receiver set, the control system being configured to apply a pulse sequence to the gradient coils and to the radio frequency transmitter and receiver set to generate image echo signals, including an image readout gradient having a first polarity and with a phase encoding gradient, and navigator echo signals in the subject of interest, the navigator echo signals resulting from a navigator echo pulse having a second polarity opposite from the first polarity of the image readout pulse used to detect the emissions, to detect the image and navigator echo signals and generate image and navigator data representative thereof, and to analyze the navigator data to characterize effects of variations in the primary magnetic field and the gradient fields during the pulse sequence.

24. The system of claim 23, wherein the control system includes a computer configured to perform the analysis of the navigator data, and a memory circuit, the memory circuit being configured to store the image and navigator data.

25. The system of claim 24, wherein the computer is further configured to correct intermediate image data derived from the image data, and to store corrected image data in the memory circuit.

26. The system of claim 25, wherein the analysis of the navigator data is performed following a one-dimensional Fourier transform of the navigator data along a readout direction.

27. The system of claim 25, wherein the intermediate image data is derived from the image data by a one-dimensional Fourier transform of the image data along a readout direction.

28. The system of claim 23, wherein the effects include a $0^{th}$ order phase shift of echo signals after one-dimensional Fourier transform, a $1^{st}$ order phase shift of echo signals after one-dimensional Fourier transform, a bulk position shift of echo signals after one-dimensional Fourier transform, and an amplitude change of integrated echo signals after one-dimensional Fourier transform.

29. A computer program for controlling operation of a magnetic resonance imaging system having a magnet configured to generate a primary magnetic field, a set of gradient coils configured to generate gradient fields in the presence of the primary magnetic field, a radio frequency transmitter and receiver set configured to generate radio frequency pulses and to detect radio frequency emissions from a subject of interest in response to the radio frequency pulses, and a control system coupled to the gradient coils and to the radio frequency transmitter and receiver set, the computer program comprising;

a machine readable medium configured to encode a control routine; and a control routine stored on the machine readable medium, the routine including instructions for commanding the control system to apply a pulse sequence to the gradient coils and to the radio frequency transmitter and receiver set to generate image echo signals, including an image readout gradient having a first polarity and with a phase encoding gradient, and navigator echo signals in the subject of interest resulting from application of a navigator gradient pulse having a second polarity opposite from the first polarity of the image readout pulse, to detect the image and navigator echo signals and generate image and navigator data representative thereof, and to analyze the navigator data to characterize effects of variations in the primary magnetic field and the gradient fields during the pulse sequence.

30. The computer program of claim 29, wherein the machine readable medium is remote from the imaging system.

31. The computer program of claim 29, wherein the machine readable medium is local to the imaging system and the control routine is stored on the machine readable medium via a network link from a remote location.

32. The computer program of claim 29, wherein the routine includes instructions for correcting intermediate image data derived from the image data, and for storing corrected image data in a memory circuit.

33. The computer program claim 32, wherein the routine includes instructions for performing a one-dimensional Fourier transform of the navigator data along a readout direction prior to the analysis.

34. The computer program of claim 33, wherein the routine includes instructions for deriving the intermediate image data from the image data by a one-dimensional Fourier transform of the image data along a readout direction.

35. The computer program of claim 29, wherein the effects include a $0^{th}$ order phase shift of echo signals after one-dimensional Fourier transform, a $1^{st}$ order phase shift of echo signals after one-dimensional Fourier transform, a bulk position shift of echo signals after one-dimensional Fourier transform, and an amplitude change of integrated echo signals after one-dimensional Fourier transform.

* * * * *